US012156375B2

(12) United States Patent
Cheng et al.

(10) Patent No.: US 12,156,375 B2
(45) Date of Patent: Nov. 26, 2024

(54) SERVER STAND AND SERVER ASSEMBLY USING THE SAME

(71) Applicant: Fulian Precision Electronics (Tianjin) Co., LTD., Tianjin (CN)

(72) Inventors: Yen-Lu Cheng, New Taipei (TW); Hao-Wen Cheng, Neihu (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 204 days.

(21) Appl. No.: 17/979,924

(22) Filed: Nov. 3, 2022

(65) Prior Publication Data
US 2023/0354551 A1 Nov. 2, 2023

(30) Foreign Application Priority Data
Apr. 27, 2022 (CN) .......................... 202210454748.3

(51) Int. Cl.
*H05K 7/20* (2006.01)
(52) U.S. Cl.
CPC ..... *H05K 7/20272* (2013.01); *H05K 7/20781* (2013.01)
(58) Field of Classification Search
CPC .................................................. H05K 7/1489
See application file for complete search history.

(56) References Cited

U.S. PATENT DOCUMENTS

2017/0020023 A1* 1/2017 Yu ........................ A47B 88/493
2017/0215298 A1* 7/2017 Chen ...................... H05K 7/183

FOREIGN PATENT DOCUMENTS

CN 113747743 A 12/2021

* cited by examiner

*Primary Examiner* — Jerry Wu
(74) *Attorney, Agent, or Firm* — ScienBiziP, P.C.

(57) ABSTRACT

A server stand with an inbuilt leakproof connecting device for coolant flow includes a frame body and a manifold. The frame body and the manifold are fixed together, the manifold has a connecting end. The server stand further includes first positioning structure and mounting assembly. The first positioning structure connects with the manifold, and the first positioning structure is near the connecting end. A bracket with blocking portion and a second positioning structure are also included, the second positioning structure can slide into connection with the first positioning structure, and the second and first positioning structures function to pre-position the bracket, the bracket being fixedly connected with the frame body. The server assembly includes a server host and an operating lever, the server host is movably connected with the operating lever.

5 Claims, 7 Drawing Sheets

SERVER STAND AND SERVER ASSEMBLY USING THE SAME

FIELD

The subject matter relates to computer equipment, and in particular, to server stand and server assembly using the same.

BACKGROUND

For the existing computer server, cooling liquid is conducted to the computer server through the server for cooling. A manifold is arranged on the frame body of the server stand, and the manifold connects to the server, so that the cooling liquid can move through the cooling system of the server.

However, there is a tolerance in the dimensions of the frame body and the manifold, and there is a tolerance in the assembly of the frame body and the server, so that a gap may be generated at the connection between the manifold and the server, or a gap may develop if the server is disturbed or moved, causing leakage of the coolant.

DETAILED DESCRIPTION

The following descriptions refer to the attached drawings for a more comprehensive description of this application. Sample embodiments of this application are shown in the attached drawings. However, this application can be implemented in many different forms and should not be construed as limited to exemplary embodiments set forth herein. These exemplary embodiments are provided to make this application thorough and complete, and to adequately communicate the scope of this application to those skilled in the field. Similar diagram labels represent the same or similar components.

The terms used herein are intended only to describe the purpose of particular exemplary embodiments and are not intended to limit this application. As used herein, the singular forms "one", "one" and "the" are intended to include the plural as well, unless the context otherwise clearly indicates it. In addition, when used herein, the words "include" and/or "include" and/or "have", integers, steps, operations and/or components, do not exclude additional or pluralities of features, regions, integers, steps, operations, components, and/or groups thereof.

Unless otherwise defined, all terms used herein (including technical and scientific terms) have the same meaning as would normally be understood by ordinary technicians in the field of this application. In addition, unless expressly defined in the context, terms such as those defined in a general dictionary shall be construed to have meanings consistent with those in the relevant technology and in the content of this application, and shall not be construed to have idealistic or overly formal meanings.

Examples of embodiments are described below in combination with the attached drawings. It should be noted that the components depicted in the attached drawings may be shown not to scale; the same or similar components will be assigned the same or similar drawing mark representation or similar technical terms.

The following is a detailed description of the specific implementation of this application, referring to the attached drawings.

Figure 1:
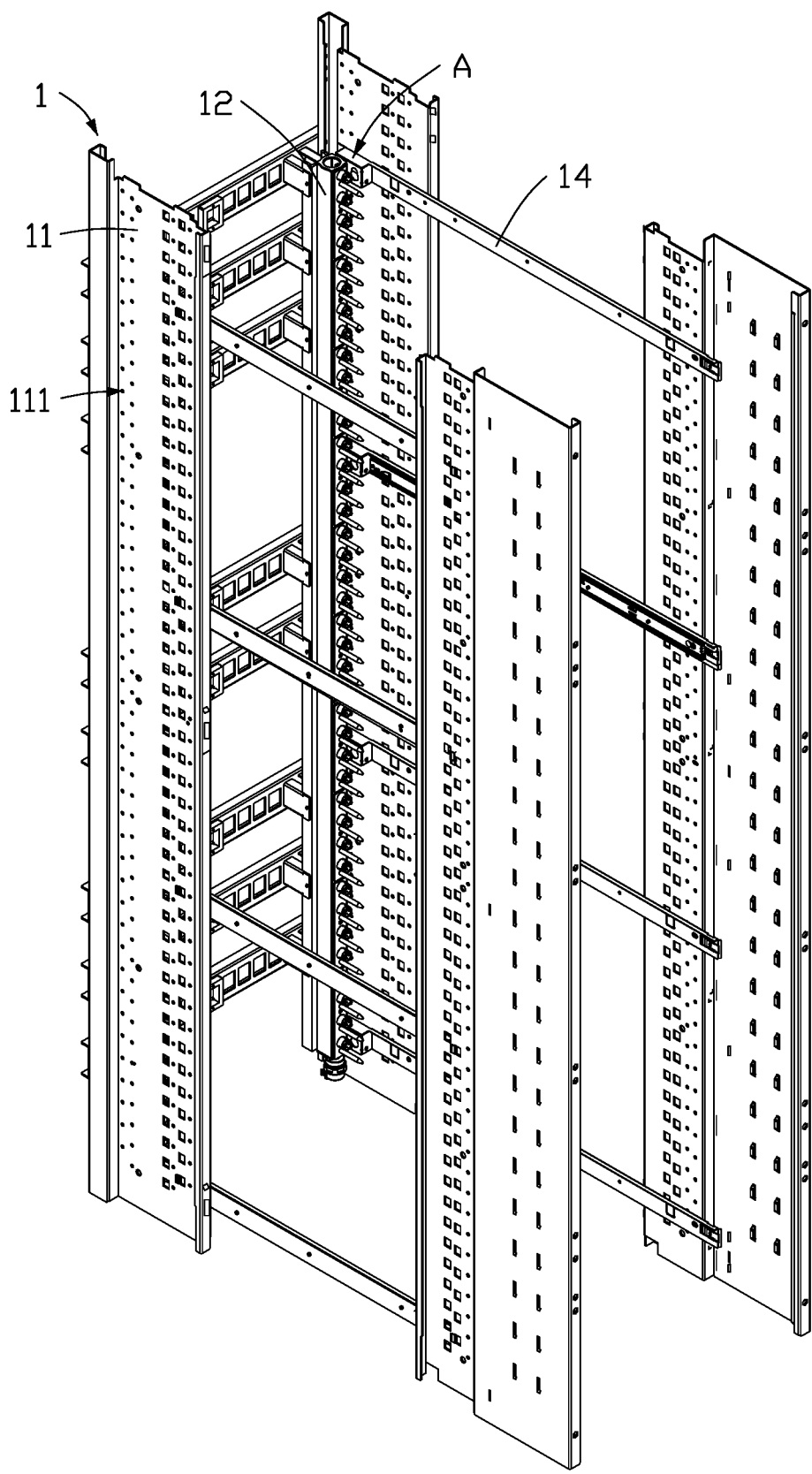
FIG. 1 is a schematic perspective view of a server stand.
Figure 2:
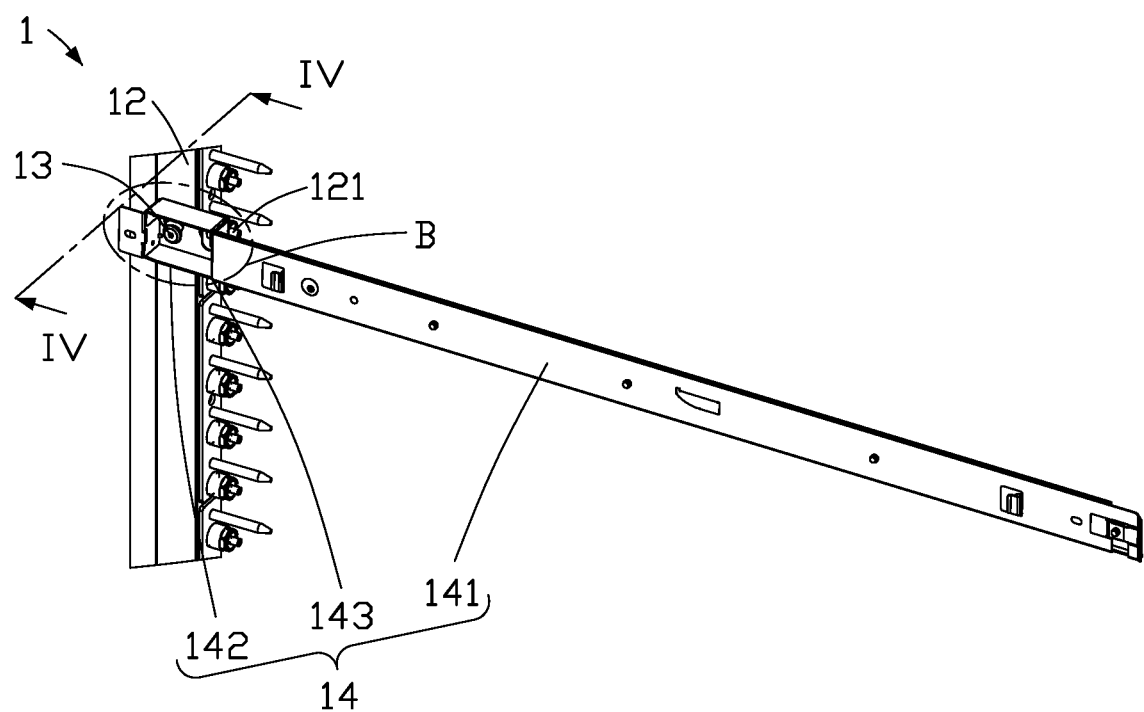
FIG. 2 is a partial schematic view of the area A of the server stand of FIG. 1.
Figure 3:
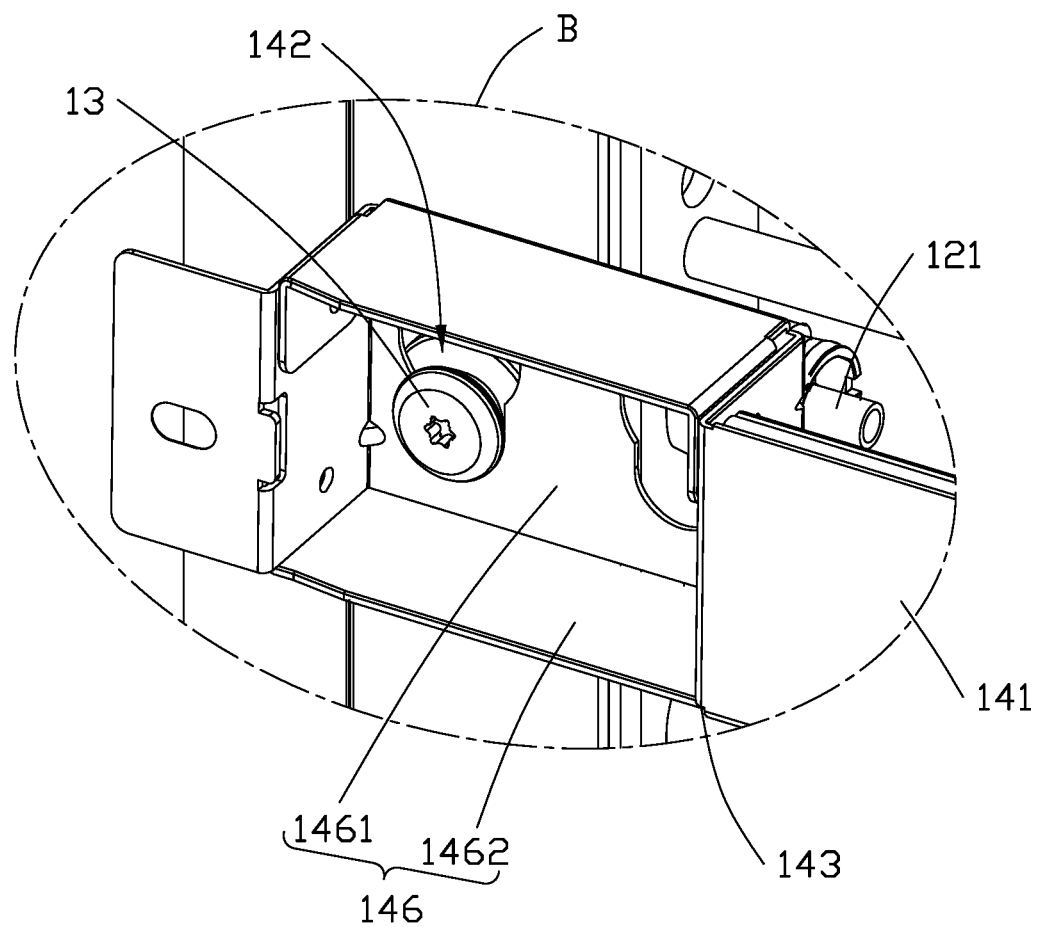
FIG. 3 is a partial enlarged schematic view of the area B of the server stand of FIG. 2.
Figure 4:
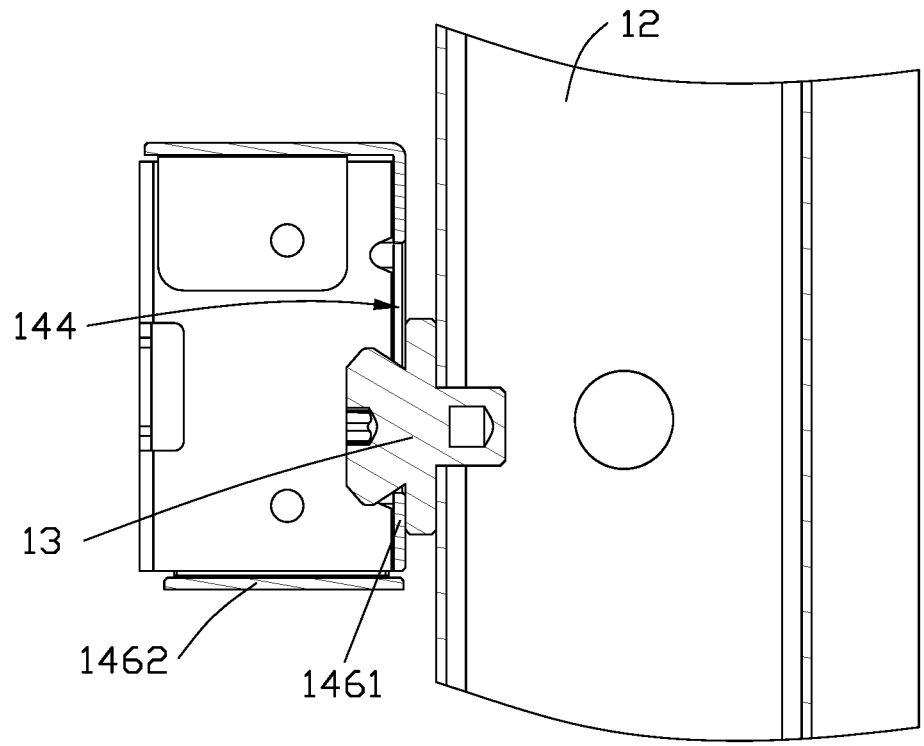
FIG. 4 is a schematic cross-sectional view along a line IV-IV of FIG. 2.
Figure 5:
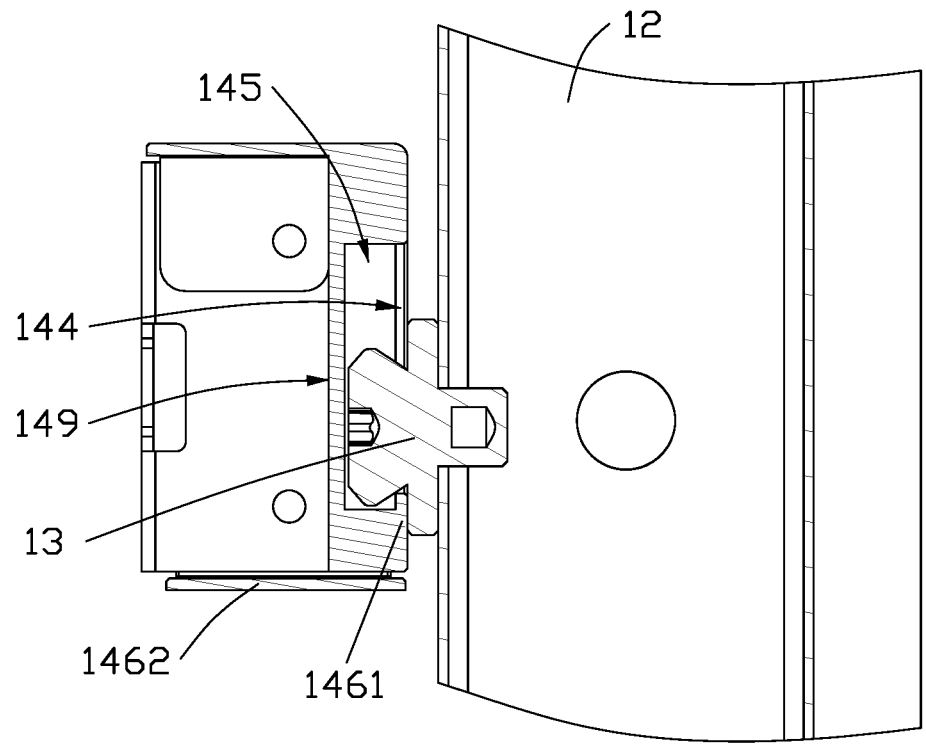
FIG. 5 is a schematic structural diagram of the second positioning structure of the server stand of FIG. 4.
Figure 6:
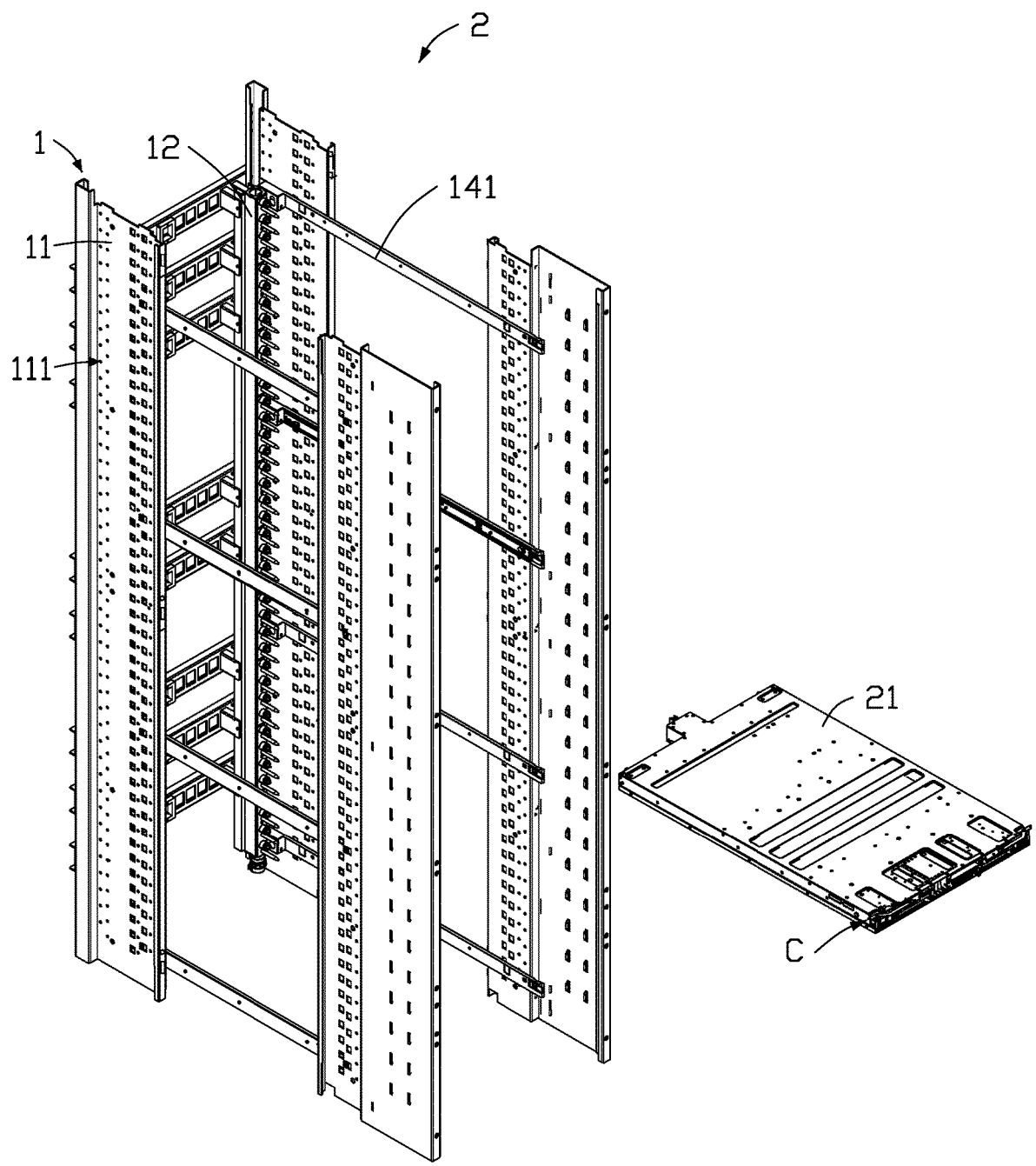
FIG. 6 is a schematic perspective view of a server assembly of the server assembly.
Figure 7:
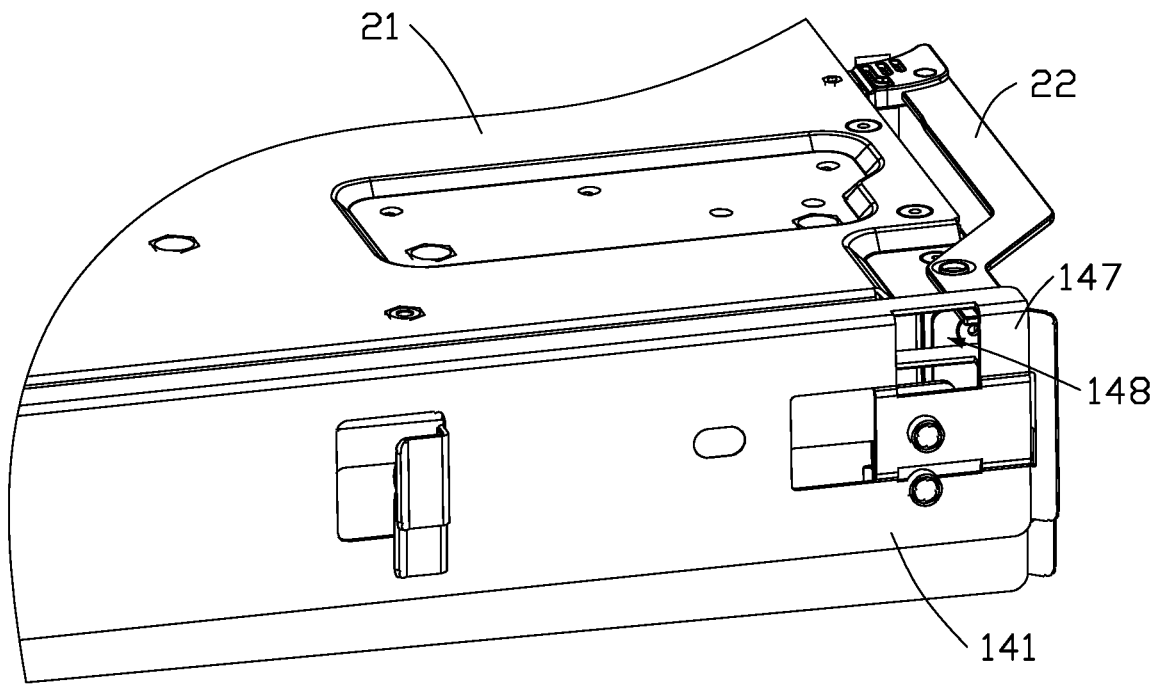
FIG. 7 is a partial schematic view of the area C of the server assembly of FIG. 6.

As shown in FIGS. 1 to 5, a server stand 1 includes a frame body 11 and a manifold 12. The frame body 11 is fixedly connected to the manifold 12. The manifold 12 is provided with a connecting end 121.

The server stand 1 further includes a first positioning structure 13 and a mounting assembly 14. The first positioning structure 13 is disposed close to the connecting end 121. The first positioning structure 13 is fixedly connected with the manifold 12. The mounting assembly 14 includes a bracket 141 and a second positioning structure 142. The second positioning structure 142 is disposed on the first end 143 of the bracket 141. The first end 143 is disposed close to the connecting end 121. The second positioning structure 142 is slidably connected with the first positioning structure 13. The second positioning structure 142 cooperates with the first positioning structure 13 to pre-position the bracket 141. The bracket 141 is fixedly connected to the frame body 11.

In one embodiment, the first positioning structure 13 is a projection, and the first positioning structure 13 and the connecting end 121 and the manifold 12 are disposed at the same height.

In one embodiment, the first end 143 includes a reinforcement structure 146. The second positioning structure 142 is disposed in the reinforcing structure 146. The reinforcement structure 146 includes a first surface 1461 and a second surface 1462 that are connected. The first surface 1461 and the second surface 1462 are perpendicular to each other. The second surface 1462 is integrally connected with the first end 143 of the bracket 141.

In one embodiment, the first end 143 of the bracket 141 is provided with at least two second positioning structures 142. At least two second positioning structures 142 are arranged along the extending direction of the connecting end 121.

Further, the manifold 12 is directly connected to the first positioning structure 13 through the connecting end 121, which simplifies assembly of the parts and reduces assembly error between the first positioning structure 13 and the connecting end 121.

The second positioning structure 142 is slidably connected with the first positioning structure 13, the bracket 141 can adjust and match the position of the second positioning structure 142 and the first positioning structure 13, and the second positioning structure 142 and the first positioning structure 13 are used for the bracket 141, the assembly error between the mounting assembly 14 and the connecting end 121 is reduced.

By reducing or eliminating assembly error between the mounting assembly 14 and the connecting end 121, accuracy of matching between the connecting end 121 and the mounting assembly 14 is improved, and the risk of coolant leakage is reduced.

In this embodiment, the server stand 1 is a frame structure including a plurality of compartments. The manifold 12 is arranged on the side of the frame body 11 in the vertical direction, and the cooling liquid is inserted into the frame body 11 through the manifold 12. The manifold 12 is provided with a plurality of connecting ends 121, and each connecting end 121 is disposed in one compartment. The connecting end 121 is used for connecting with the cooling liquid interface, so that each layer can receive cooling liquid. The first positioning structure 13 may be in the shape of a cylinder.

The bracket 141 is an elongated metal mounting rail. One end of the bracket 141 is the first end 143. The first end 143 is disposed close to the connecting end 121.

The second positioning structure 142 is arranged to cooperate with the first positioning structure 13. For example, if the first positioning structure 13 is a projection, the second positioning structure 142 uses the projection as a reference for positioning and fixing the first end 143.

The second surface 1462 is integrally connected with the first end 143 of the bracket 141 and prevents deformation of the first end 143, to improve the positional accuracy of the first end 143. The second positioning structure 142 is disposed in the reinforcing structure 146 for improving the positional accuracy of the second positioning structure 142.

Along the length direction of the bracket 141, the first end 143 of the bracket 141 may be provided with two second positioning structures 142. The two second positioning structures 142 are arranged along the extension direction of the connecting end 121 for adjusting the bracket 141 to connect with different sizes of equipment.

In one embodiment, the second positioning structure 142 includes a hanging hole 144 opened at the first end 143, and the boss-shaped first positioning structure 141 cooperates with the hanging hole 144 to connect the boss-shaped first positioning structure 141 with the hanging hole 144.

In this embodiment, the second positioning structure 142 is a through hole with a shape similar to a gourd, that is, the outline of the through hole is composed of two circles of different sizes. The through holes are opened in the first surface 1461 of the reinforcement structure 146.

The boss-shaped first positioning structure 141 is in the shape of an inverted cone, and the boss-shaped first positioning structure 141 and the through-hole-shaped second positioning structure 142 are snapped together by an inverted button. The head of the boss-shaped first positioning structure 141 is passed through the larger circle of the through-hole-shaped second positioning structure 142 to slide the head of the boss-shaped first positioning structure 141 into a smaller circle along the outline of the through hole, so that the first positioning structure 13 and the second positioning structure 142 are connected together. The first positioning structure 13 and the second positioning structure 142 are disassembled by being moved in the opposite direction to separate them.

In one embodiment, the second positioning structure 142 includes a groove 145. The groove 145 is disposed at the first end 143. The boss-shaped first positioning structure 141 cooperates with the groove 145 to connect the boss-shaped first positioning structure 141 with the groove 145. The first positioning structure 141 in the shape of a boss is in contact with but detachable from the surface of the groove 145.

In this embodiment, the second positioning structure 142 can also be a groove 145, and a counterbore is opened on the first surface 1461 to form the groove 145. Compared with the hanging hole 144, the groove 145 has an additional bottom wall 149. The bottom wall 149 enhances the strength of the second positioning structure 142.

The second positioning structure 142 may be a gourd-shaped groove 145. The contour of the groove 145 consists of two circles of different sizes. The groove 145 is formed in the first surface 1461 of the reinforcing structure 146. The boss-shaped first positioning structure 141 is in the shape of an inverted cone. The boss-shaped first positioning structure 141 and the groove 145—shaped second positioning structure 142 can be snapped together.

When the first positioning structure 13 is connected with the second positioning structure 142, the head of the boss-shaped first positioning structure 141 is passed through the larger circle of the groove-shaped second positioning structure 142, the head of the boss-shaped first positioning structure 141 slides into a smaller circle along the contour of the groove-shaped second positioning structure 142, and hangs upside down on the surface of the small circle of the groove 145. Disassembly of the first positioning structure 13 and the second positioning structure 142 is by moving them in opposite directions.

The embodiment of the present application further provides a server assembly 2, which includes a server host 21, an operation lever 22, and a server stand 1. The server host 21 is movably connected to the operating lever 22. The server host 21 is installed in the bracket 141. The bracket 141 is provided with a blocking portion 147, and the blocking portion 147 is provided at an end opposite to the connecting end 121. The blocking portion 147 can abut the operating lever 22.

In one embodiment, the brackets 141 are arranged on the same side of the frame body 11 in layers and spaced apart. The manifold 12 is fixed to the side wall of the frame body 11 in the vertical direction. The connecting ends 121 are evenly spaced on the same side of the manifold 12. The connecting end 121 is arranged perpendicular to the manifold 12.

In one embodiment, the side wall of the frame body 11 is provided with a mounting hole 111. The bracket 141 is fixed to the side wall of the frame body 11 through the mounting hole 111. A plurality of server hosts 21 can be connected to the server stand 1.

In one embodiment, the blocking portion 147 is provided with an opening 148, and the operating lever 22 abuts against the inner wall of the opening 148.

Further, the server host 21 is mounted on the bracket 141. The connecting end 121 of the coolant port (not shown) of the server host 21 and the manifold 12 is pre-positioned by the second positioning structure 142 and the first positioning structure 13. The server host 21 is pushed into the bracket 141 by the operating lever 22, so that the coolant port (not shown) of the server host 21 is connected with the connecting end 121 of the manifold 12. Assembly error between the server mainframe 21 and the connecting end 121 is reduced by installing the component 14, the matching accuracy of the manifold 12 and the server mainframe 21 is improved, and the risk of coolant leakage is reduced.

In this embodiment, a server assembly 2 is provided, including a server host 21, an operating lever 22, and a server stand 1. The bracket 141 is provided with a blocking portion 147, the blocking portion 147 is provided with an opening 148, and the operating lever 22 abuts against the inner wall of the opening 148. The blocking portion 147 is disposed on the side away from the connecting end 121. The blocking portion 147 abuts the operating lever 22 and server host 21 is fixed to the bracket 141. The server host 21 is inserted into the bracket 141, and the brackets 141 are arranged in layers on the same side of the frame body 11. The manifold 12 is fixed to the side wall of the frame body 11 in the vertical direction. A plurality of connecting ends 121 is arranged in layers and at intervals on the same side of the manifold 12. The connecting end 121 is perpendicular to the manifold 12. The connecting end 121 and the bracket 141 are arranged at intervals to leave a gap between the server host 21, and the gap is used for heat dissipation of the server host 21. The side wall of the frame body 11 is provided with mounting holes 111, and the bracket 141 is fixed to the side wall of the frame body 11 through the mounting hole 111.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A server assembly comprising a server host, an operating lever and a server stand, wherein the server stand comprises a frame body and a manifold, the frame body is fixedly connected to the manifold, and the manifold is provided with a connecting end, wherein the server stand further comprising: a first positioning structure is fixedly connected to the manifold, the first positioning structure is disposed near the connecting end; a mounting assembly comprises a bracket with at least two second positioning structures, the at least two second positioning structures are disposed at a first end of the bracket and extending along an extension direction of the connecting end, the first end is disposed close to the connecting end, the second positioning structure and the first positioning structure is slidably connected, the second positioning structure and the first positioning structure are used for pre-positioning of the bracket, and the bracket is fixedly connected to the frame body; and the server host is movably connected with the operating lever, and the server host is inserted into the bracket, the bracket is provided with a blocking portion, the blocking portion is arranged on a side away from the connecting end, and the blocking portion is connected with the operating lever in an abutting manner; and the first positioning structure and the connecting end and the manifold are disposed at the same height; and the second positioning structure comprises a hanging hole opened at the first end, and the boss-shaped first positioning structure is connected to the hanging hole, the holes are matched so that the boss-shaped first positioning structure is detachably connected to the hanging holes; and the second positioning structure comprises a groove provided at the first end, and the boss-shaped first positioning structure is connected to a recess, the groove is matched to make the boss-shaped first positioning structure detachably connected to the groove, and the surface of the boss-shaped first positioning structure is separable from a surface of the groove.

2. The server assembly of claim 1, wherein the first end comprises a reinforcement structure, the second positioning structure is disposed in the reinforcement structure, and the reinforcement structure comprises a first surface and a second surface, the first surface is perpendicular to the second surface, and the second surface is connected to the first end.

3. The server assembly of claim 1, wherein a plurality of the brackets are arranged on the same side of the frame body in layers, and the manifold is vertically aligned with the side of the frame body, a plurality of the connecting ends are arranged on the same side of the manifold in layers and intervals, and the connecting ends are arranged vertically with the manifold.

4. The server assembly of claim 1, wherein the blocking portion is provided with an opening, and the operating lever abuts against an inner wall of the opening.

5. The server assembly of claim 1, wherein a side wall of the frame body is provided with a mounting hole, the bracket is fixed to the side wall of the frame body through the mounting hole, and a plurality of the server host is arranged and arranged on the server stand.

\* \* \* \* \*